United States Patent [19]

Kawakami et al.

[11] Patent Number: 4,991,060
[45] Date of Patent: Feb. 5, 1991

[54] PRINTED CIRCUIT BOARD HAVING CONDUCTORS INTERCONNECTED BY FOAMED ELECTROCONDUCTIVE PASTE

[75] Inventors: Shin Kawakami; Satoshi Haruyama; Hirotaka Okonogi, all of Saitama, Japan

[73] Assignee: Nippon CMK Corporation, Japan

[21] Appl. No.: 441,078

[22] Filed: Nov. 24, 1989

[51] Int. Cl.⁵ ............................................. H05K 1/18
[52] U.S. Cl. .................................. 361/410; 174/261; 361/406
[58] Field of Search ............... 361/382, 386, 387, 400, 361/401, 404–406, 408, 412, 413; 174/256, 257, 259, 261, 262

[56] References Cited

U.S. PATENT DOCUMENTS 4,683,653  8/1987  Iwasa .................................. 29/830
4,885,662 12/1989  Bartholomew et al. ............. 361/388

Primary Examiner—Gregory D. Thompson
Attorney, Agent, or Firm—Bruce L. Adams; Van C. Wilks

[57] ABSTRACT

A printed circuit board has a vibration-absorbing electroconductive body disposed in a through-hole to electrically interconnect electrical conductors disposed on opposed sides of the board. The electroconductive body is formed from the expansion of a decomposed, foamed electroconductive paste which is heated and hardened to form the electroconductive body.

4 Claims, 1 Drawing Sheet

PRINTED CIRCUIT BOARD HAVING CONDUCTORS INTERCONNECTED BY FOAMED ELECTROCONDUCTIVE PASTE

BACKGROUND OF THE INVENTION

1. Field of the Invention

The present invention relates to a printed circuit board, and, more particularly, to electroconductive paste to be enclosed in a through hole connecting circuits disposed on the two sides of a printed circuit board.

2. Description of the Related Art

Hitherto, double-side printed circuit boards have been designed in such a manner that predetermined patterns of electroconductive bodies are formed by two sheets of copper foil laminated on the two sides of an insulating substrate of a copper laminated board, through holes being formed at predetermined positions in the substrate, and electroconductive paste which is normally made of copper paste being enclosed in predetermined through holes so that electrical connection between two circuits on the two sides of the insulating substrate is established.

The other manufacturing processes such as mounting of the electronic parts, soldering, and forming insulating coating are performed in known ways. Thus detailed description of these factors will be omitted here.

There has, however, been a demand for the size of such printed circuit boards to be reduced in accordance with the trend for reducing the size of electronic parts. Furthermore, in order to reduce the number of manufacturing processes, a significant degree of automation has been achieved. This raises the problem that when a copper paste is introduced from one side into the through holes by means of silk screen printing, the copper paste cannot be properly adhered to the conductive body of the circuit disposed on the reverse side, leading to a condition of defective conduction.

If an excessive amount of copper paste is supplied on the silk screen when silk screen printing with copper paste is performed, the copper paste overflows the target regions, causing short circuits or the like between the circuits on the two sides. There is, therefore, a certain limitation to the amount of paste that can be supplied on the silk screen, but this restricted amount of paste is insufficient to overcome the problem of defective conduction.

To this end, an object of the present invention is to provide a printed circuit board capable of overcoming the above-described problems and of displaying a high level of reliability and in which the generation of defective conduction can be prevented without comprising the conventionally achieved level of facility for manufacture and maximized economic advantage.

SUMMARY OF THE INVENTION

A printed circuit board according to the present invention in which a printed circuit is formed on either one side or both sides of an insulating substrate, and a through hole penetrating the insulating substrate is formed, wherein circuits on the two sides are electrically connected by an electroconductive paste enclosed in the through hold. The printed circuit board comprises foaming electroconductive paste as the electroconductive paste.

A printed circuit board according to the present invention can overcome defective conduction by exploring foaming electroconductive paste. The foaming electroconductive paste is enclosed in the through holes where it expands in the through holes bringing it into complete contact with the conductors disposed on the two sides so that the two sides are connected to each other. Furthermore, such a foaming electroconductive paste exhibits vibration-absorption characteristics, and formation of cracks or the like can be prevented therein.

BRIEF DESCRIPTION OF THE DRAWINGS

The accompanying

DESCRIPTION OF THE PREFERRED EMBODIMENTS

Figure 1:
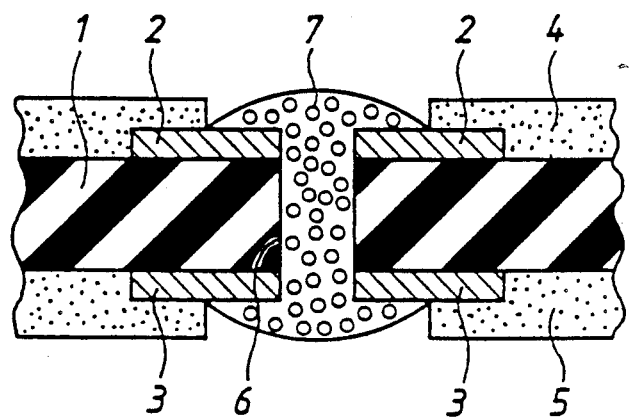
FIG. 1 is an enlarged cross-sectional view which illustrates a printed circuit board according to the present invention.

An embodiment of the present invention will now be described with reference to the drawings.

The accompanying drawing is a partial enlarged cross-sectional view which illustrates an embodiment of a printed circuit board according to the present invention.

In FIG. 1 reference numeral 1 represents an insulating substrate, 2 and 3 represent conductors formed by predetermined patterns and disposed on two sides of the insulating substrate 1, reference numerals 4, and 5 represent predetermined solder resist films, and 6 represents a through hole formed in the insulating substrate 1.

The foaming electroconductive paste according to the present invention is formed by enclosing foaming electroconductive paste 7 from one side in the through hole 6 by means of silk screen printing or the like, and the thus-enclosed foaming electroconductive paste 7 is heated up to 100° to 200° C. at which the foaming material therein can be decomposed, the thus-decomposed foaming material thereby being foamed. In addition, the thus-foamed foaming material is then subjected to a predetermined means such as an application of ultraviolet rays as to be hardened.

The foaming electroconductive paste according to the present invention can be prepared by, for example, mixing several % of a known foaming material with usual copper paste, the quantity of the foaming material being optionally determined on the basis of the post-treatment and the desired degree of expansion. It is preferable to arrange the conditions as to make the magnification of expansion of the volume twice due to the above-described heating.

The accompanying drawing is a view which illustrates a state of the electroconductive paste 7 after it has been subjected to the heating. The central portions of the two sides project as a result of expansion due to foaming of the foaming material as an alternative to the pits formed in the central portions of the two sides in the conventional manner. Therefore, contact with the conductors 2, 3 disposed on the two sides can be established, causing defective conduction to be prevented. A great volume of electroconductive paste 7 cannot conventionally be supplied using silk screen printing. However, according to the present invention in which the foaming material is contained therein, the volume of the electroconductive paste can be increased in the through hole at the time of performing the silk screen printing.

Since the other treatments to be performed in order to manufacture the printed circuit board, such as mounting electronic parts, soldering, forming the insulating film, and forming the protective film do not relate to the present invention. Thus, their descriptions are omitted here.

As described above, a complete connection can be established between the conductors disposed on the two sides by increasing the volume of the electroconductive paste in the through holes by using electroconductive paste in which foaming material is contained according to the present invention. In addition, there is not any necessity to increase the quantity of foaming material at the time of performing silk screen printing when the electroconductive paste is enclosed in the through holes.

In addition, the generation of cracks in the conductor or in a through hole can be overcome due to the shock absorption capability and vibration absorbing performance exhibited by the foaming body.

What is claimed is:

1. A printed circuit board comprising:
   an insulating substrate having a pair of opposed major surfaces and a through-hole extending therethrough from one major surface to the other major surface;
   a first conductor disposed on one major surface of the substance in the region of the through-hole;
   a second conductor disposed on the other major surface of the substrate in the region of the through-hole; and
   a foamed electroconductive paste disposed in the through-hole and extending outwardly thereof and overlying portions of the first and second conductors in the region of the through-hole, the foamed electroconductive paste electrically interconnecting the first and second conductors and being effective to absorb external shocks applied to the substrate.

2. A printed circuit board according to claim 1 wherein the foamed electroconductive paste comprises an expanded foamed paste having a volume at least twice the original volume thereof before expansion.

3. A printed circuit board according to claim 2; wherein the foamed electroconductive paste includes copper.

4. A printed circuit board according to claim 1; wherein the first and second conductors define predetermined patterns on the opposed major surfaces of the substrate.

* * * * *